(12) United States Patent
Hayata et al.

(10) Patent No.: US 6,464,126 B2
(45) Date of Patent: *Oct. 15, 2002

(54) BONDING APPARATUS AND BONDING METHOD

(75) Inventors: Shigeru Hayata, Tachikawa; Ryuichi Kyomasu, Kodaira; Satoshi Enokido, Hachioji; Toshiaki Sasano, Sagamihara, all of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/766,950

(22) Filed: Jan. 22, 2001

(65) Prior Publication Data

US 2001/0011669 A1 Aug. 9, 2001

(30) Foreign Application Priority Data

Jan. 21, 2000 (JP) ........................................ 2000-012738

(51) Int. Cl.[7] ............................................ H01L 21/607
(52) U.S. Cl. ...................... 228/105; 228/110.1; 228/1.1; 228/9
(58) Field of Search ................................ 228/105, 103, 228/4.5, 9, 10, 11, 1.1, 110.1, 180.5

(56) References Cited

U.S. PATENT DOCUMENTS

| | | | | |
|---|---|---|---|---|
| 4,671,446 A | * | 6/1987 | Sherman | 228/4.5 |
| 5,516,023 A | * | 5/1996 | Kono | 228/4.5 |
| 5,702,049 A | * | 12/1997 | Biggs et al. | 228/105 |
| 5,803,341 A | * | 9/1998 | Abe | 228/102 |
| 6,337,489 B1 | * | 1/2002 | Matsumoto et al. | 250/559.08 |

FOREIGN PATENT DOCUMENTS

| | | | | |
|---|---|---|---|---|
| JP | 2982000 | | 11/1999 | H01L/21/60 |
| JP | 2000-21923 | * | 1/2000 | |

* cited by examiner

*Primary Examiner*—M. Alexandra Elve
*Assistant Examiner*—Len Tran
(74) *Attorney, Agent, or Firm*—Koda & Androlia

(57) ABSTRACT

A wire bonding apparatus and method in which an axial center of a bonding tool is moved to the vicinity of a near reference member, laser diodes are sequentially lit, images of the reference member and bonding tool in the horizontal directions are acquired by a position detection camera, and amounts of deviation between the tool and the reference member are measured. Then, the position detection camera is caused to approach the reference member, and amounts of deviation between the optical axis of the position detection camera and the reference member are measured by the position detection camera. The accurate offset amounts are determined from the measured values and amounts of movement. Image light of the tool and reference member is conducted to the position detection camera by prisms and half-mirror, without a camera for detecting the amount of deviation between the tool and reference member.

10 Claims, 14 Drawing Sheets

BONDING APPARATUS AND BONDING METHOD

BACKGROUND OF THE INVENTION

1. Field of the Invention

The present invention relates to a bonding apparatus and bonding method and more specifically to an apparatus and method that can accurately calculate the amount of offset between a processing member such as a bonding tool, etc. and a position detection imaging device that takes images of bonding objects.

2. Prior Art

In, for instance, a wire bonding apparatus, a position detection camera and a bonding arm are disposed on a bonding head that is carried on an XY table. The position detection camera images a reference pattern of a bonding member in order to specify the bonding points on bonding objects such as semiconductor devices, etc. The bonding arm has at its one end a tool (bonding tool) that performs bonding. The position detection camera and the tool are installed on the bonding head so that the optical axis of the position detection camera and the axial center of the tool are separated by a fixed distance. Thus, the tool and bonding arm do not interfere with the visual field of the position detection camera when the position detection camera images the reference pattern of the bonding member. The distance between the optical axis of the position detection camera and the axial center of the tool is generally referred to as the "offset".

Since the position detection camera determines a reference point that is used to ascertain the position to which the tool is moved, it is extremely important to ascertain exactly how far the position detection camera is offset from the tool. However, the actual offset amount varies from instant to instant according to the thermal expansion of the camera holder and bonding arm caused by radiant heat from the high-temperature bonding stage. Accordingly, the offset amount must be corrected at the time that bonding work is initiated and at an appropriate timing during the bonding work.

For this purpose, in a bonding method and apparatus (Japanese Patent No. 2982000) proposed by the present applicant, a reference member is disposed in a specified position, a position detection camera is moved to a point above the reference member of this reference member, and the positional relationship between the reference member and the optical axis of the position detection camera is measured. Then, a tool (bonding tool) is moved to a point above the reference member in accordance with an amount of offset that is stored in memory beforehand, and the positional relationship between the reference member and the tool is measured by an offset correction camera. The accurate offset amount is then determined by correcting the offset amount that is stored in memory beforehand based upon these measurement results. In this structure, the offset amount between the position detection camera and the tool is determined with good precision as a result of the interposition of the reference member.

However, the above structure has some problems. An offset correction camera that is used exclusively for offset correction must be installed separately from the position detection camera used to detect the positions of bonding points. As a result, the structure of the bonding apparatus becomes too complicated.

SUMMARY OF THE INVENTION

The present invention is to solve the above-described problem.

The object of the present invention is to provide an apparatus and method which operates without the use of an exclusive offset correction camera even in cases where a reference member is used.

In other word, the above object is accomplished by a unique structure of the present invention for a bonding apparatus, and the unique structure comprises: a position detection imaging device that images bonding objects, a reference member that is disposed in a specified position, and optical members that conduct image light of the reference member and a processing member, which processes (or perform bonding on) the bonding objects, to the position detection imaging device.

In the above structure, the optical members are provided so as to conduct image light of the processing member and reference member to the position detection imaging device. Thus, the position detection imaging device that detects the positions of the bonding objects images not only the processing member but also the reference member. Accordingly, the apparatus can operate without an exclusive offset correction camera even in cases where a reference member is used. In the following descriptions, the term "processing member" refers to any of various types of working heads that perform physical work on semiconductor devices.

Furthermore, in the above structure, the optical members are provided so as to conduct the image light, which is of the processing member and the reference member and captured from a plurality of different directions, to the position detection imaging device.

As a result, images of the processing member and reference member are captured from a plurality of different directions. More accurate positional information can be thus obtained from these images.

Furthermore, in the above structure, the position detection imaging device can be equipped with a telecentric lens.

In cases where a position detection imaging device that detects the positions of bonding objects is used for the imaging of both the processing member and the reference member, the distance from the bonding objects to the position detection imaging device differs from the distance from the processing member and reference member to the position detection imaging device, so that the size of the images of the latter varies. Accordingly, it is conceivable that the positional relationship between the processing member and the reference member cannot be correctly detected. However, in the above structure, the position detection imaging device is equipped with a telecentric lens, and this telecentric lens possesses characteristics in which the image size (i.e., the distance from the optical axis) does not vary even if the position of the object of imaging fluctuates. Accordingly, the detection of positional relationships based on the imaging of the position detection imaging device can be accurately accomplished in all cases.

In addition, in the above structure, a corrective lens can be further disposed in the light path leading to the position detection imaging device, and images of the reference member and processing member are focused on the image-focusing plane of the position detection imaging device via the corrective lens.

In this structure, the corrective lens is further disposed in the light path leading to the position detection imaging device, and images of the reference member and processing member are focused on the image-focusing plane of the position detection imaging device via the corrective lens. Accordingly, the imaging (or taking of image) can be accomplished under good focusing conditions in all cases, even if the distance from the bonding objects to the position detection imaging device differs from the distance from the processing member and reference member to the position detection imaging device.

Furthermore, in the present invention, the corrective lens can be held as an integral unit with the reference member.

In this structure, the corrective lens is integral with the reference member. Accordingly, when the position detection imaging device and processing member are moved in order to image the processing member and reference member, the corrective lens is brought to be in the light path that leads to the position detection imaging device. In other words, the corrective lens is interposed in and removed from the light path by an extremely simple structure.

The above object is accomplished by a further unique structure of the present invention for a bonding apparatus that comprises: a position detection imaging device that takes images of bonding objects; a reference member that is disposed in a specified position; a light source that illuminates a processing member, which processes the bonding objects, and the reference member; and a screen member onto which images of the processing member and the reference member are projected by the illumination from the light source, and in this structure, the distance from the position detection imaging device to the bonding objects when the position detection imaging device is in an attitude in which the bonding objects are imaged by the position detection image device is substantially equal to the distance from the position detection imaging device to the screen member when the position detection imaging device is in an attitude in which the processing member is caused to approach the reference member.

In the above structure, images of the processing member and reference member illuminated by the light source are projected onto a screen member. The distance from the position detection imaging device to the bonding objects when the position detection imaging device is in the attitude in which the position of the bonding objects is detected by the position detection imaging device is set so that this distance is substantially equal to the distance from the position detection imaging device to the screen member when the position detection imaging device is in an attitude in which the processing member is caused to approach the reference member. Accordingly, the screen member can be imaged under focused conditions similar to those obtained when the bonding objects are imaged by the position detection imaging device. As a result, such imaging can be accomplished under good focusing conditions in all cases.

The above object is further accomplished by unique steps of the present invention employed in a bonding apparatus that includes a position detection imaging device that images bonding objects, a processing member which is installed so as to be offset with respect to the position detection imaging device and to process the bonding objects, and a reference member that is disposed in a specified position, and the unique steps of the present invention comprises:

a step in which the positional relationship between the reference member and the position detection imaging device in a first attitude in which the position detection imaging device is caused to approach the reference member is measured by the position detection imaging device, a step in which image light of the reference member and the processing member in a second attitude in which the processing member is caused to approach the reference member is conducted to the position detection imaging device, and the positional relationship between the processing member and the reference member is measured by the position detection imaging device, and a step in which the accurate offset amount is determined based upon the above measurement results and the movement amounts of the position detection imaging device and the processing member between the first attitude and second attitude.

Furthermore, the above object is accomplished by a unique structure for a bonding apparatus that comprises:

a position detection imaging device that images bonding objects, a processing member which is installed so as to be offset with respect to the position detection imaging device and to process the bonding objects, a reference member that is disposed in a specified position, and an operation control device that determines the amount of offset based upon:

the measured value obtained when the positional relationship between the reference member and the position detection imaging device in a first attitude in which the position detection imaging device is caused to approach the reference member is measured by the position detection imaging device, the measured value obtained when image light of the reference member and the processing member in a second attitude in which the processing member is caused to approach the reference member is conducted to the position detection imaging device, and the positional relationship between the processing member and the reference member is measured by the position detection imaging device, and the above measurement results and the movement amounts of the position detection imaging device and the processing member between the above first and second attitudes.

DETAILED DESCRIPTION OF THE INVENTION

Figure 1:
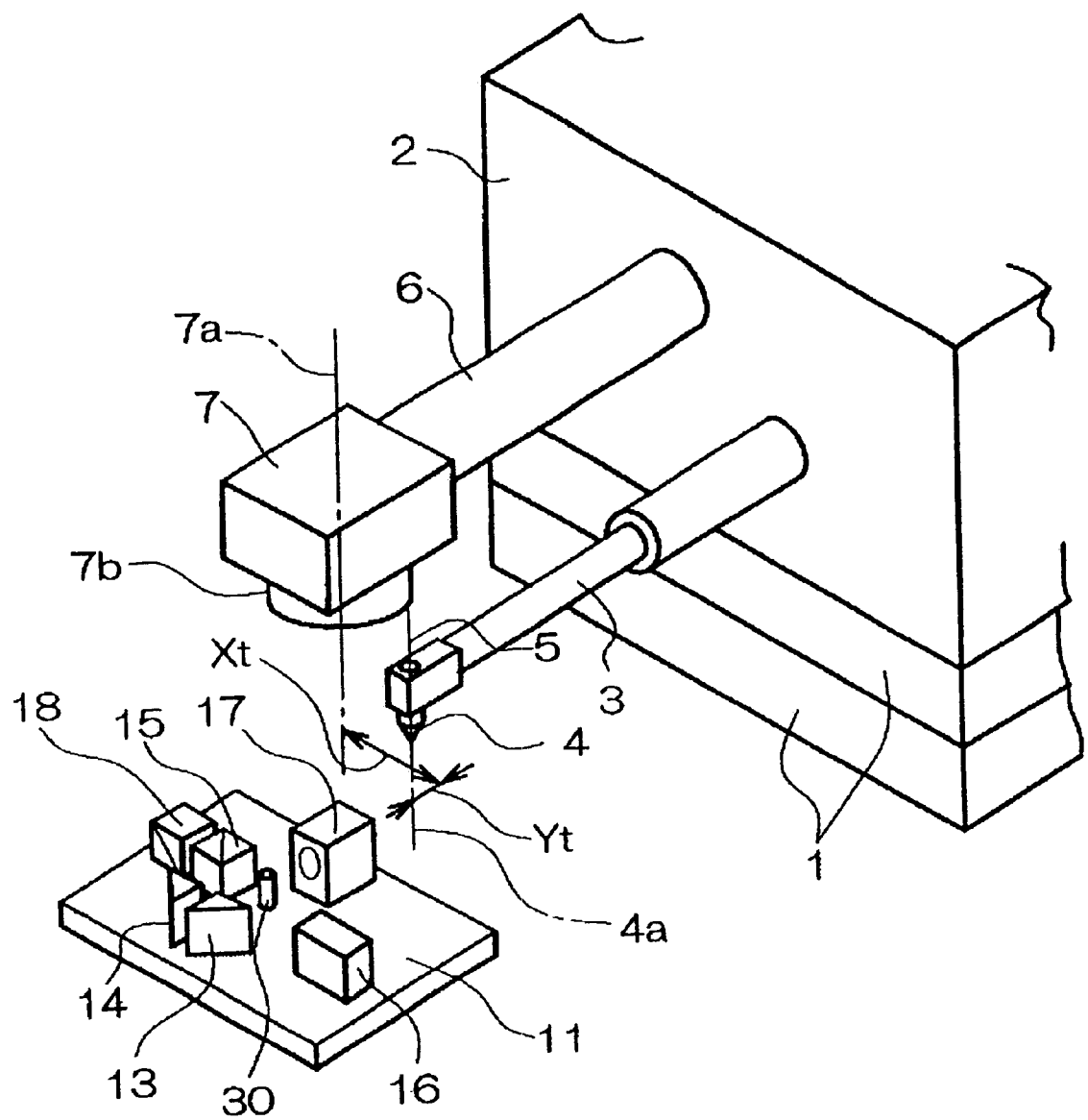
FIG. 1 is a perspective view which shows the essential portion of the bonding apparatus according to the first embodiment of the present invention.

FIG. 1 illustrates a first embodiment of the present invention. As shown in FIG. 1, a bonding arm 3 is installed so as to be moved upward and downward on a bonding head 2 which is carried on an XY table 1. The bonding arm 3 is driven upward and downward by a vertical driving means (not shown). A tool (bonding tool) 4 is attached to the tip end portion of the bonding arm 3, and a wire 5 is passed through this tool 4. Furthermore, a camera holder 6 is fastened to the bonding head 2, and a position detection camera 7, which is a photoelectric transducer type imaging device equipped with a charge-coupled device (CCD), is fastened to the tip end portion of the camera holder 6. The optical axis 7a of the position detection camera 7 and the axial center 4a of the tool 4 are both directed perpendicularly downward. The optical axis 7a and axial center 4a are offset by offset amounts Xt and Yt in the X and Y directions. The XY table 1 is accurately moved in the X and Y directions by two pulse motors (not shown) that are installed in the vicinity of the XY table 1. The above is a known structure.

A reference member supporting stand 11 on which a reference member 30 is carried is disposed in the vicinity of a bonding stage (not shown) which positions and carries a semiconductor device (not shown). Prisms 13, 14 and 18, a half-mirror 15, and lasers diodes 16 and 17 used as illuminating light sources, are installed on the reference member supporting stand 11.

Figure 2:
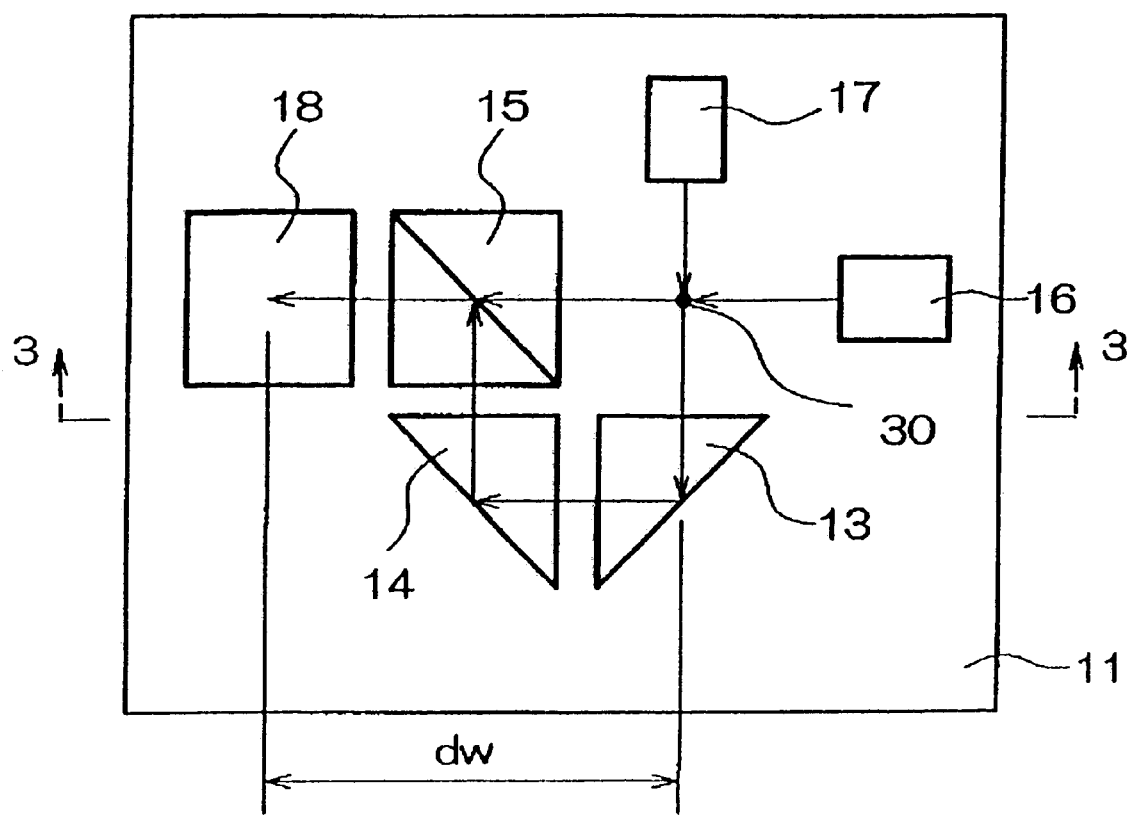
FIG. 2 is a plan view thereof.

As shown in FIG. 2, the prism 13 is positioned on the lower side (with respect to FIG. 2) of the reference member 30, and the prism 14 is positioned on the left side (with respect to FIG. 2) of the prism 13. The half-mirror 15 is positioned on the left side (with respect to FIG. 2) of the reference member 30, and the laser diode 16 is positioned on the right side of the reference member 30. The laser diode 17 is positioned on the opposite side of the reference member 30 from the prism 13. The laser diodes 16 and 17 are set so that they generate parallel light. The prism 18 is installed on the left side (with respect to FIG. 2) of the half-mirror 15. The interval or space dw between the center of the reflective surface of the prism 18 and the reference member 30 is substantially equal to the offset amount Xt between the optical axis 7a of the position detection camera 7 and the axial center 4a of the tool 4 in the X direction.

Figure 3:
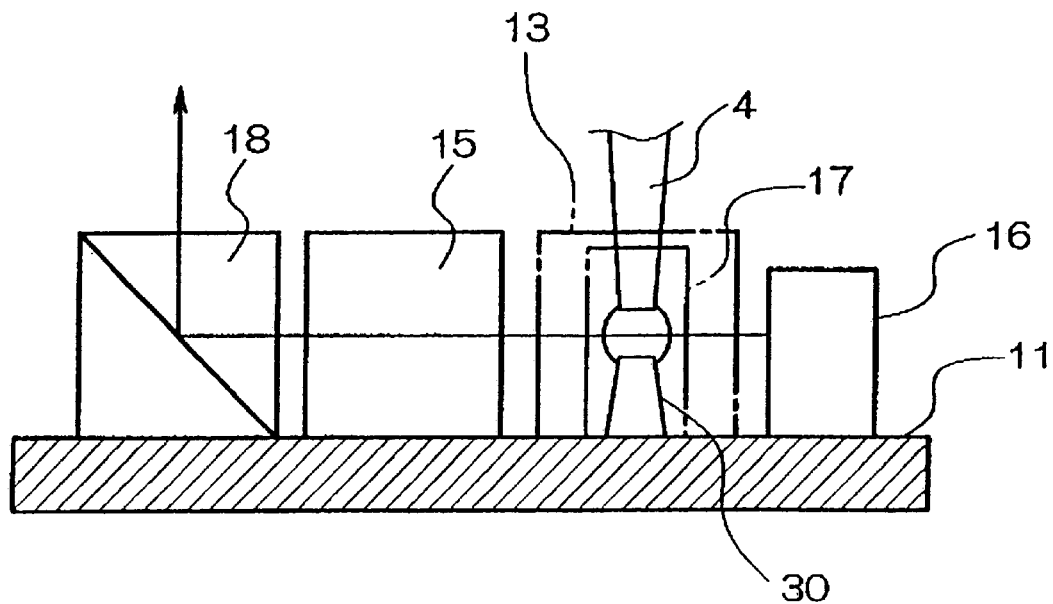
FIG. 3 is a partially cut-away front view thereof seen from the direction of arrows 3—3 in FIG. 2.

The reflective surface of the prism 13 crosses the X direction (i.e., the direction formed by an imaginary line between the laser diode 16 and half-mirror 15) at an angle of −45°. The reflective surface of the others prism 14 and the reflective surface of the half-mirror 15 are parallel to each other. These reflective surfaces of the prism 14 and half-mirror 15 cross the X direction at an angle of 45°. As seen from FIG. 3, the reflective surface of the prism 18 crosses the horizontal direction at an angle of 45°. Accordingly, light from the laser diode 17 reaches the reflective surface of the prism 18 after being reflected by the prisms 13 and 14 and the reflective surface of the half-mirror 15. Meanwhile, light from the laser diode 16 reaches the reflective surface of the prism 18 after passing through the half-mirror 15. Then, the light from both laser diodes 16 and 17 is reflected by the reflective surface of the prism 18, and is thus conducted to the position detection camera 7. It is possible to use mirror-surface bodies such as mirrors, etc. instead of the prisms 13, 14 and 18.

The position detection camera 7 is equipped with a lens 7b, which is a telecentric lens. In the following description, the term "telecentric lens" refers to a telecentric optical system, i.e., an optical system that is constructed so that the principal light rays that are focused as an image pass through a focal point on the back side of the lens. Telecentric lenses have a broad tolerance range for positional-deviation in the direction facing the image-focusing plane. They are generally known for the fact that the size of the image (i.e., the distance from the optical axis) does not vary even when the objective position fluctuates in the case of illumination by transmitted light that is parallel light. Such lenses are used in various types of industrial measuring instruments, and telecentric lenses or optical systems with close-to-telecentric characteristics are widely used in bonding apparatuses as well.

Figure 4:
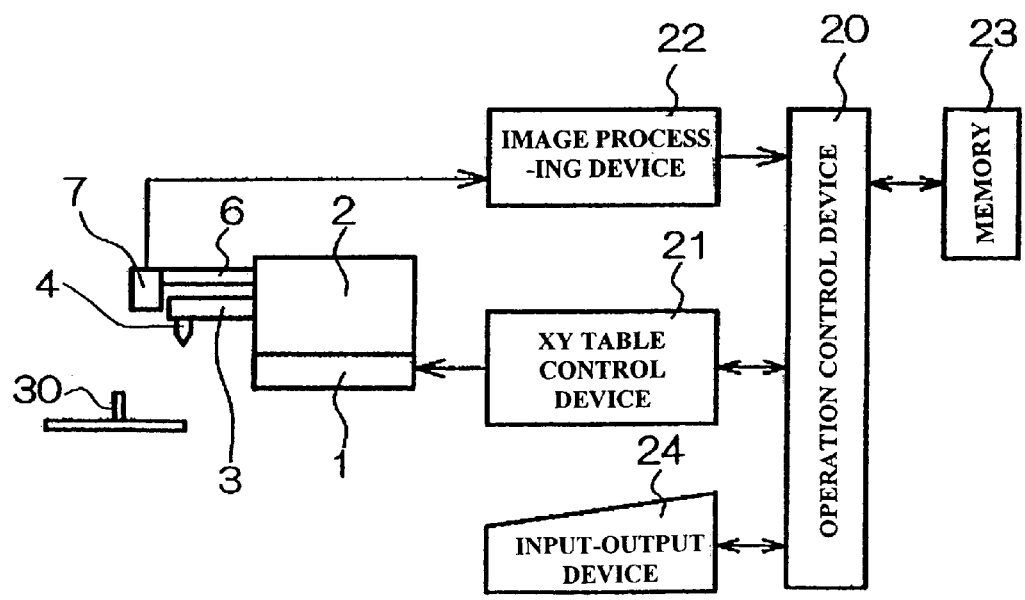
FIG. 4 is a block diagram of the control system of the first embodiment.
Figure 5:
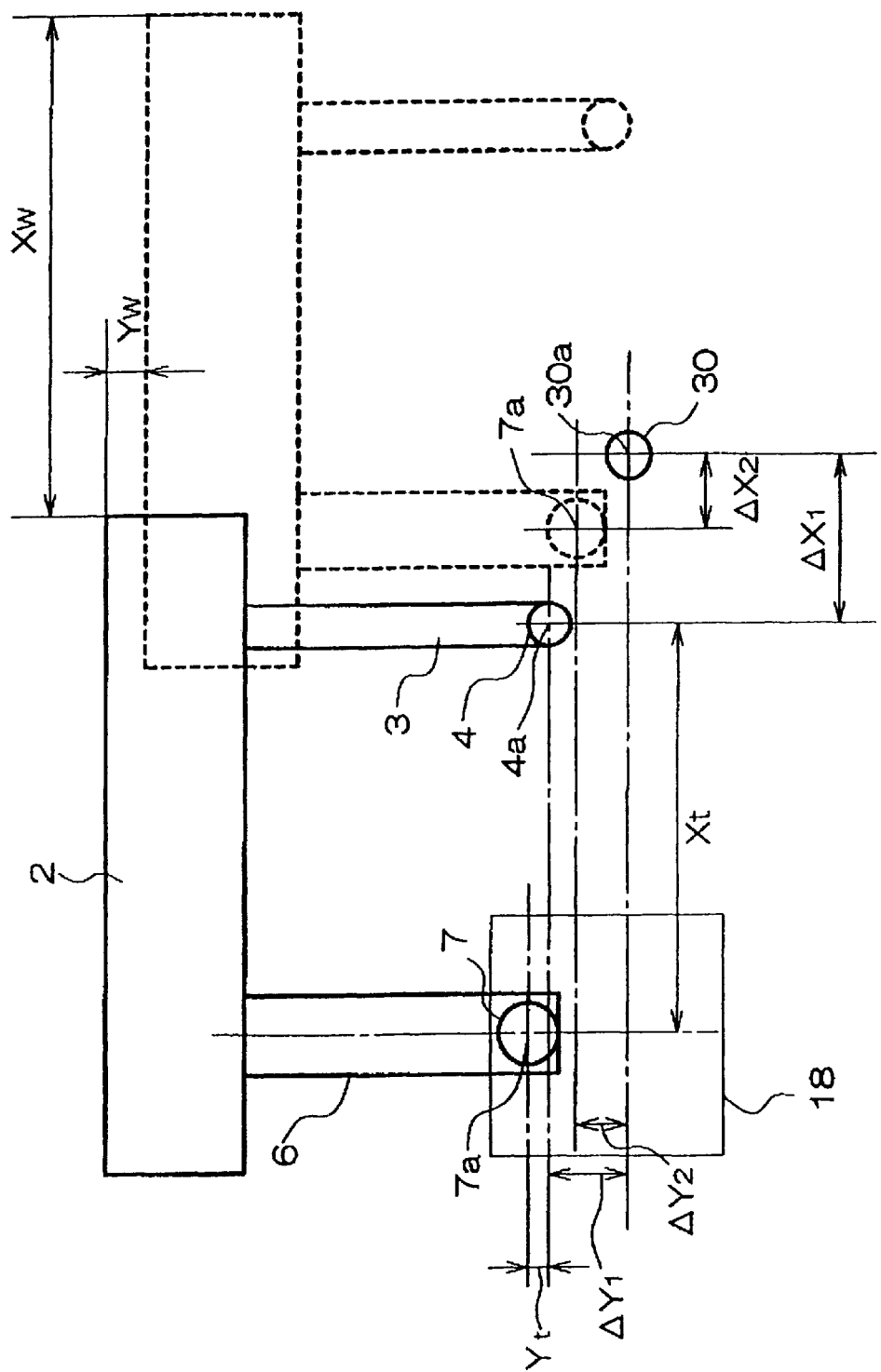
FIG. 5 is a plan view of the positional relationship of the tool, position detection camera and reference member in offset correction.

As shown in FIGS. 4 and 5, the XY table 1 is driven by commands from an operation control device 20 via an XY table control device 21. The images picked up by the position detection camera 7 are converted into electrical signals and processed by an image processing device 22, and the accurate offset amounts Xt and Yt are calculated by the operation control device 20 (which consists of a computer) using a method that will be described below. Offset amounts Xw and Yw are stored beforehand in a memory 23. Accordingly, if the respective differences between the accurate offset amounts Xt and Yt and the offset amounts Xw and Yw stored beforehand in the memory 23, i.e., the offset correction amounts, are designated as ΔX and ΔY, these accurate offset amounts Xt and Yt, the offset amounts Xw and Yw that are stored beforehand and the offset correction amounts ΔX and ΔY are related as shown by Numerical Expression 1. The reference numeral 24 is an input-output device.

$$Xt = Xw + \Delta X$$
$$Yt = Yw + \Delta Y$$

Numerical Expression 1

Next, the method used to calculate the offset amounts Xt and Yt will be described.

First, as indicated by the solid lines in FIG. 5, the XY table 1 is driven by commands from the operation control device 20 via the XY table control device 21 so that the axial center 4a of the tool 4 is positioned in the vicinity of the reference member 30 (FIG. 3), and the tool 4 is lowered to a height where it is almost touching the reference member 30. Here, it is sufficient if the tool 4 is in a position that allows the position detection camera 7 to image the tool 4 and reference member 30; it is not necessary for the axial center 30a of the reference member 30 and the axial center 4a of the tool 4 to coincide.

Then, the tool 4 and reference member 30 are both imaged by the position detection camera 7, and the positional relationship between these two components, that is the values of $\Delta X_1$, and $\Delta Y_1$, is measured.

Figure 6A:
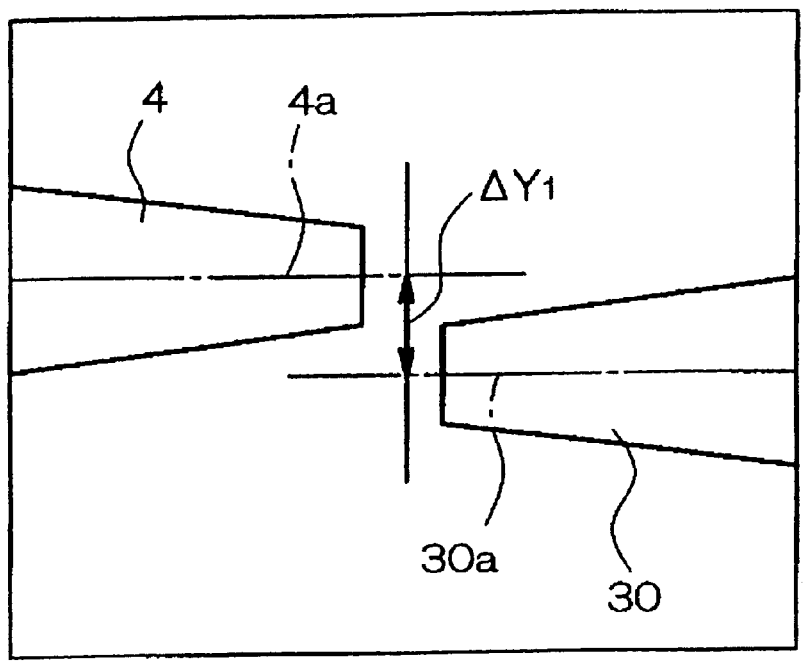
FIGS. 6A and 6B are explanatory diagrams which show the images obtained in an attitude in which the tool is caused to approach the reference member.

First, if the laser diode 16 is lit and the laser diode 17 is extinguished, the image light of the tool 4 and reference member 30 passes through the half-mirror 15 and is then reflected by the reflective surface of the prism 18 and conducted to the position detection camera 7 in the form of shadows with respect to the light from the laser diode 16. As a result, an image such as that shown in FIG. 6A is obtained by the position detection camera 7. The amount of deviation $\Delta Y_1$ between the axial center 4a of the tool 4 and the axial center 30a of the reference member 30 in the Y direction is calculated by subjecting the abovementioned image to appropriate image processing.

Figure 6B:
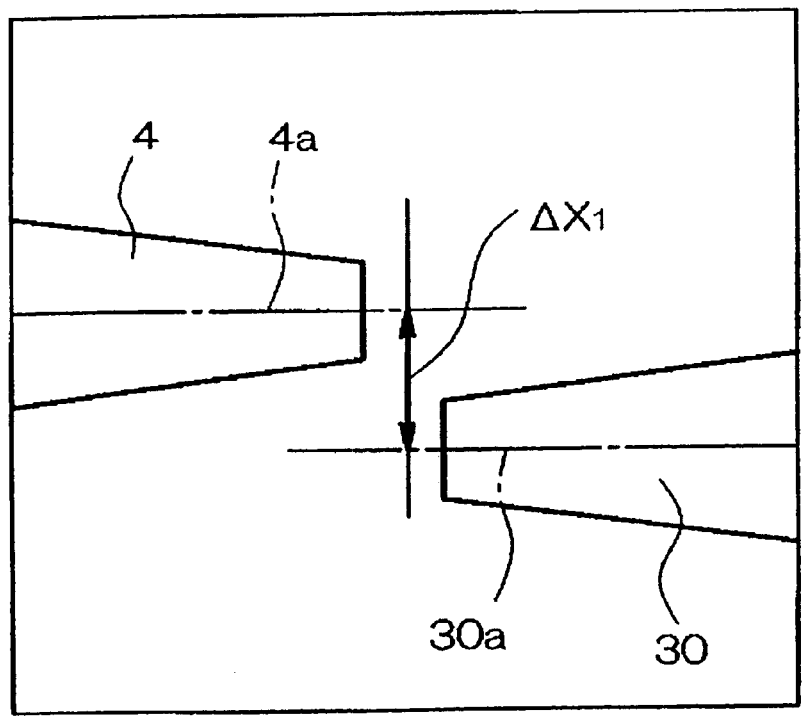
Figure 7:
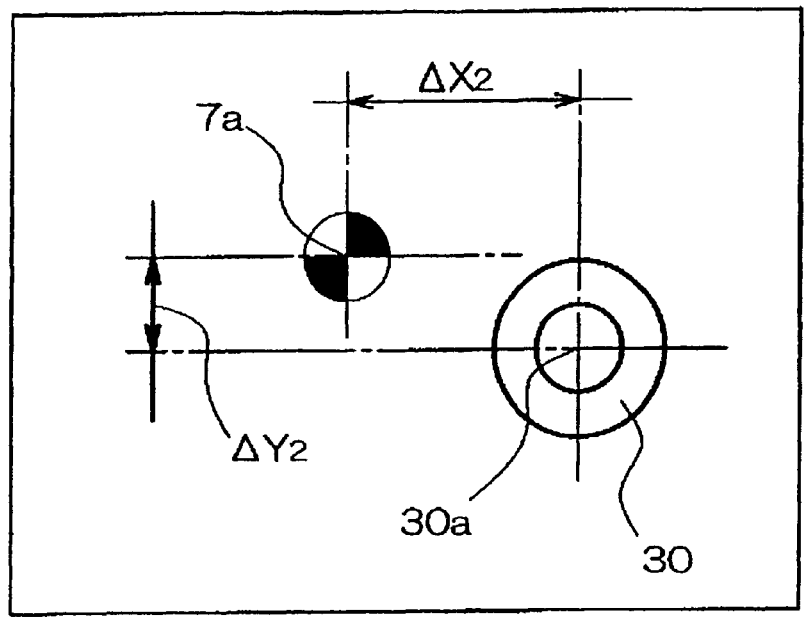
FIG. 7 is an explanatory diagram which shows the image obtained in an attitude in which the position detection camera is caused to approach the reference member.

Next, if the laser diode 16 is extinguished and the laser diode 17 is lit, the images of the tool 4 and reference member 30 are reflected by the prisms 13 and 14, reflected by the reflective surface of the half-mirror 15, further reflected by the reflective surface of the prism 18 and conducted to the position detection camera 7 in the form of shadows with respect to the light from the laser diode 17. As a result, an image such as that shown in FIG. 6B is obtained by the position detection camera 7. The amount of deviation $\Delta X_1$ between the axial center 4a of the tool 4 and the axial center 30a of the reference member 30 in the X direction is calculated by subjecting the abovementioned image to appropriate image processing.

When the positional relationship between the tool 4 and the reference member 30, i.e., the values of $\Delta X_1$ and $\Delta Y_1$, are thus measured, the operation control device 20 then drives the XY table 1 via the XY table control device 21 in accordance with the offset amounts Xw and Yw stored beforehand in the memory 23, so that the position detection camera 7 is moved to the vicinity of the reference member 30 as indicated by the dotted line in FIG. 5. Then, the reference member 30 is imaged in this state, and the amounts of deviation $\Delta X_2$ and $\Delta Y_2$ between the axial center 30a of the reference member 30 and the optical axis 7a of the position detection camera 7 are calculated by subjecting this image to appropriate image processing.

If the offset amounts Xw and Yw stored beforehand in memory are identical to the accurate offset amounts Xt and Yt, then the offset correction amounts $\Delta X$ and $\Delta Y$ are both zero. Accordingly, $\Delta X_1$ and $\Delta Y_1$ should agree with $\Delta X_2$ and $\Delta Y_2$. However, in cases where the offset amounts Xw and Yw stored beforehand in memory are approximate values, or in cases where the camera holder 6 or bonding arm 3 expands as a result of thermal effects so that the offset amounts Xt and Yt vary, $\Delta X_1$ and $\Delta Y_1$ do not agree with $\Delta X_2$ and $\Delta Y_2$, so that errors (offset correction amounts) $\Delta X$ and $\Delta Y$ are generated. Thus, the offset correction amounts $\Delta X$ and $\Delta Y$ are calculated by means of Numerical Expression 2 from the measured values $\Delta X_1$ and $\Delta Y_1$ and the measured values $\Delta X_2$ and $\Delta Y_2$.

$$\Delta X = \Delta X_1 - \Delta X_2$$
$$\Delta Y = \Delta Y_1 - \Delta Y_2 \quad \text{Numerical Expression 2}$$

Accordingly, the operation control device 20 calculates the offset correction amounts $\Delta X$ and $\Delta Y$ according to Numerical Expression 2, and then calculates the accurate offset amounts Xt and Yt by adding the offset correction amounts $\Delta X$ and $\Delta Y$ to the offset amounts Xw and Yw (stored beforehand in memory) in accordance with Numerical Expression 1. The operation control device 20 then corrects (updates) the offset amounts Xw and Yw stored in the memory 23 to the accurate offset amounts Xt and Yt. The accurate offset amounts Xt and Yt thus determined are used as new offset amounts Xw and Yw of the position detection camera 7 and tool 4 in subsequent bonding operations.

Thus, in the above embodiment, the prisms 13, 14 and 18 and a half-mirror 15 which conduct image light of the tool 4 and reference member 30 to the position detection camera 7 are provided. Accordingly, the position detection camera 7 that detects the positions of bonding objects can also be used for the imaging of the tool 4 and reference member 30, so that the system can operate without a camera used exclusively for offset correction.

In cases where the position detection camera 7 is also used for the imaging of the tool 4 and reference member 30, the distance from the bonding objects to the position detection camera 7 would be different from the distance from the tool 4 and reference member 30 to the position detection camera 7, resulting in that the size of the image of the latter varies so that the positional relationship between the tool 4 and reference member 30 cannot be correctly detected. Thus, in the above embodiment, the position detection camera 7 has a lens 7b, which is a telecentric lens, that possesses characteristics in that the image size does not vary even if the position of the object of imaging fluctuates. Accordingly, the detection of positional relationships based on such imaging can be accurately performed in all cases, which is a desirable feature. Furthermore, since the images of the tool 4 and reference member 30 captured from a plurality of different directions are conducted to the position detection camera 7, more accurate positional information can be obtained based upon these images.

In the above embodiment, the laser diodes 16 and 17 are set to generate parallel light. However, instead of such a structure, the pinholes and lenses can be combined with light sources that emit non-parallel light so as to obtain parallel light. Examples of suitable light sources that emit non-parallel light in this case include LEDs (light-emitting diodes), halogen lamps, tungsten lamps and emission ports of optical fibers, etc. Pinholes may be omitted. However, when pinholes are not used, the parallel orientation of the light rays would deteriorate.

Next, the second embodiment of the present invention will be described.

Figure 8:
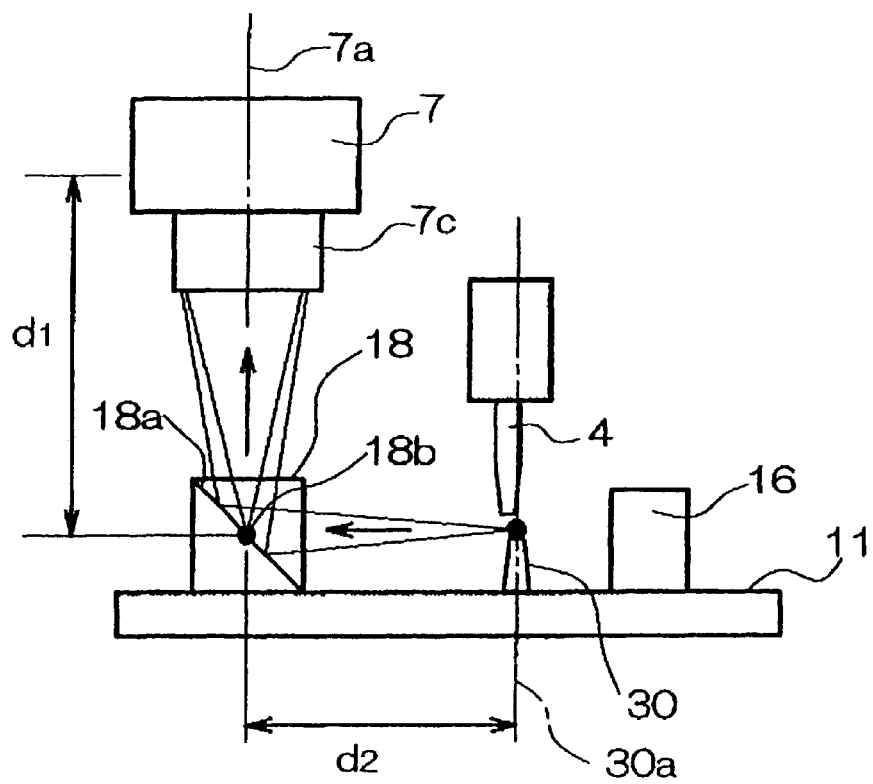
FIG. 8 is a front view of the essential portion of the bonding apparatus according to the second embodiment of the present invention.
Figure 14A:
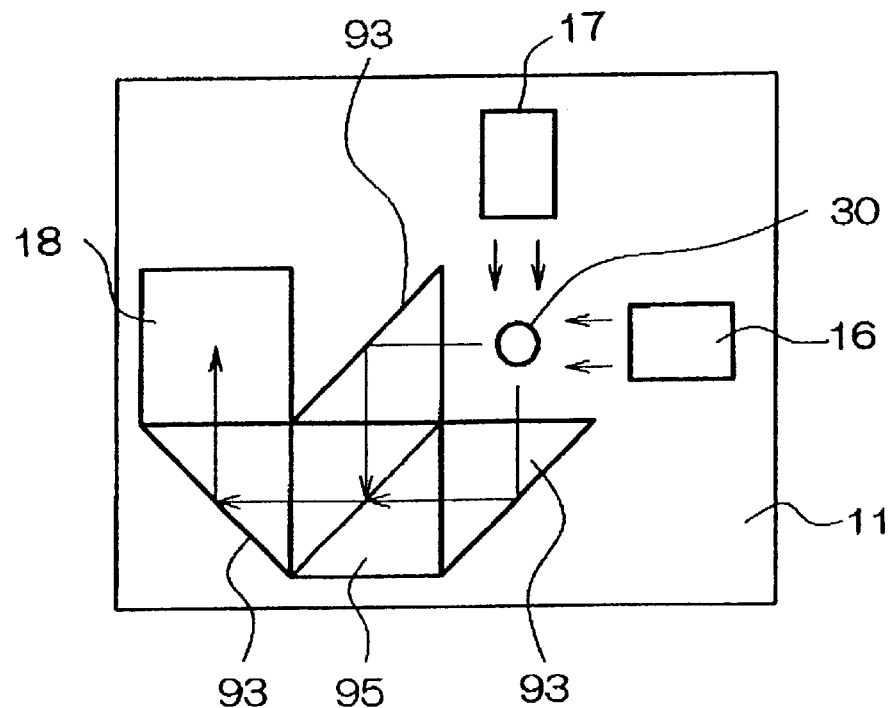
FIG. 14A is a plan view of the essential portion of the optical members of the second through seventh embodiments of the present invention.

In this second embodiment, as seen from FIG. 14A, three prisms 93 and a half-mirror 95 are installed in contact with each other. In order to reflect the reflected light upward and conduct this light to the position detection camera 7, a prism 18 which has a reflective surface that is inclined by 45° is installed in contact with the other optical elements, and illumination is provided from two directions by laser diodes 16 and 17. The lens 7c mounted in the position detection camera 7 is constructed so that the focal length can be altered by a driving device (not shown) in accordance with the control output of the operation control device 20. In addition, the focal position of the lens 7c can be varied between the center 18b of the reflective surface 18a of the prism 18, which is away from the image-focusing plane of the position detection camera 7 by a distance of $d_1$, and the axial center 30a of the reference member 30, which is away from the image-focusing plane of the position detection camera 7 by a distance of $d_1+d_2$. It is not necessary that the lens 7c be a telecentric lens. In FIG. 8, the prisms 93 and half-mirror 95 are omitted. Structures not specifically described in the respective embodiments below are substantially the same as the structures of the above-described first embodiment. Such structures are labeled with the same reference numerals, and a description of these structures will be omitted.

In the second embodiment, both the tool 4 and the reference member 30 are imaged by the position detection camera 7 in a state in which the distance to the focal position is $d_1+d_2$. Next, the position detection camera 7 is moved so that the camera 7 is caused to approach the reference member 30, and the lens 7c is driven so that the distance to the focal position is changed to $d_1$. Then, the reference member 30 is directly imaged by the position detection camera 7 in this state.

Thus, in this embodiment, respective appropriate focal positions are selected when both the tool 4 and the reference member 30 are imaged by the position detection camera 7, and also when the reference member 30 is directly imaged by the position detection camera 7. Accordingly, this embodiment is advantageous in that the imaging action can be accomplished under good focusing conditions in all cases. In this embodiment, furthermore, the light path length from the tool 4 and reference member 30 can be made equal in two directions. Also, since the three prisms 93, the prism 18 and the half-mirror 95 are in contact with each other, assembly precision of the optical members can easily be obtained.

In the above second embodiment, the focal position is altered by driving the lens 7c. However, instead of using the above-described structure, it is possible to use to a vertical driving means that raises and lowers the position detection camera 7, so that focusing is accomplished by such raising and lowering action of the position detection camera 7.

Figure 14B:
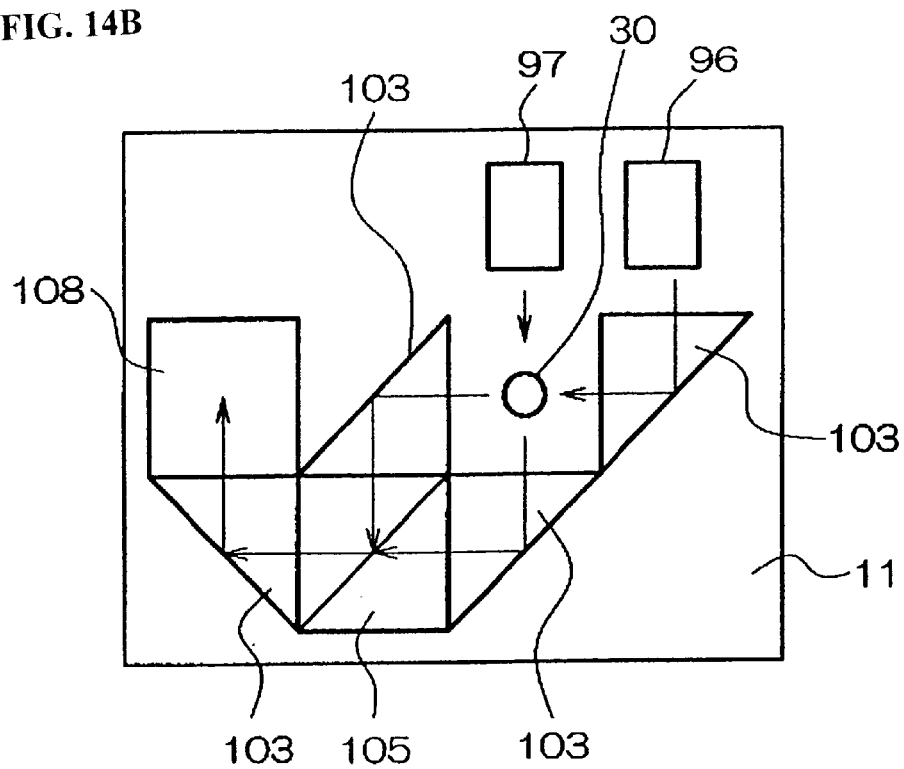
FIG. 14B is a plan view of the modification of these optical members.

FIG. 14B shows a modification of the second embodiment. In this structure, four prisms 103 and a half-mirror 105, as well as a prism 108 which has a reflective surface that is inclined at an angle of 45° in order to reflect the light reflected by the aforementioned prisms and half-mirror upward and conduct this light to the position detection camera 7 are provided, so that these optical elements are in contact with each other. This arrangement is advantageous in that the laser diodes 96 and 97 used to provide illumination from two directions can be installed adjacent to each other. Furthermore, it is also possible to use a single light source in order to provide illumination from two directions, and to separate the images of the tool 4 and reference member 30 from two directions by introducing the light path corresponding to one direction into the position detection camera 7 either selectively or with the degree of screening (or degree of transmission) varied by means of a mechanical shutter or liquid crystal shutter. In this case, it is also possible to achieve mutual separation of the images from two directions by dividing the image acquired by the position detection camera 7 in synchronization with the variation in the degree of screening effected by the mechanical shutter or liquid crystal shutter.

Next, the third embodiment of the present invention will be described.

Figure 9:
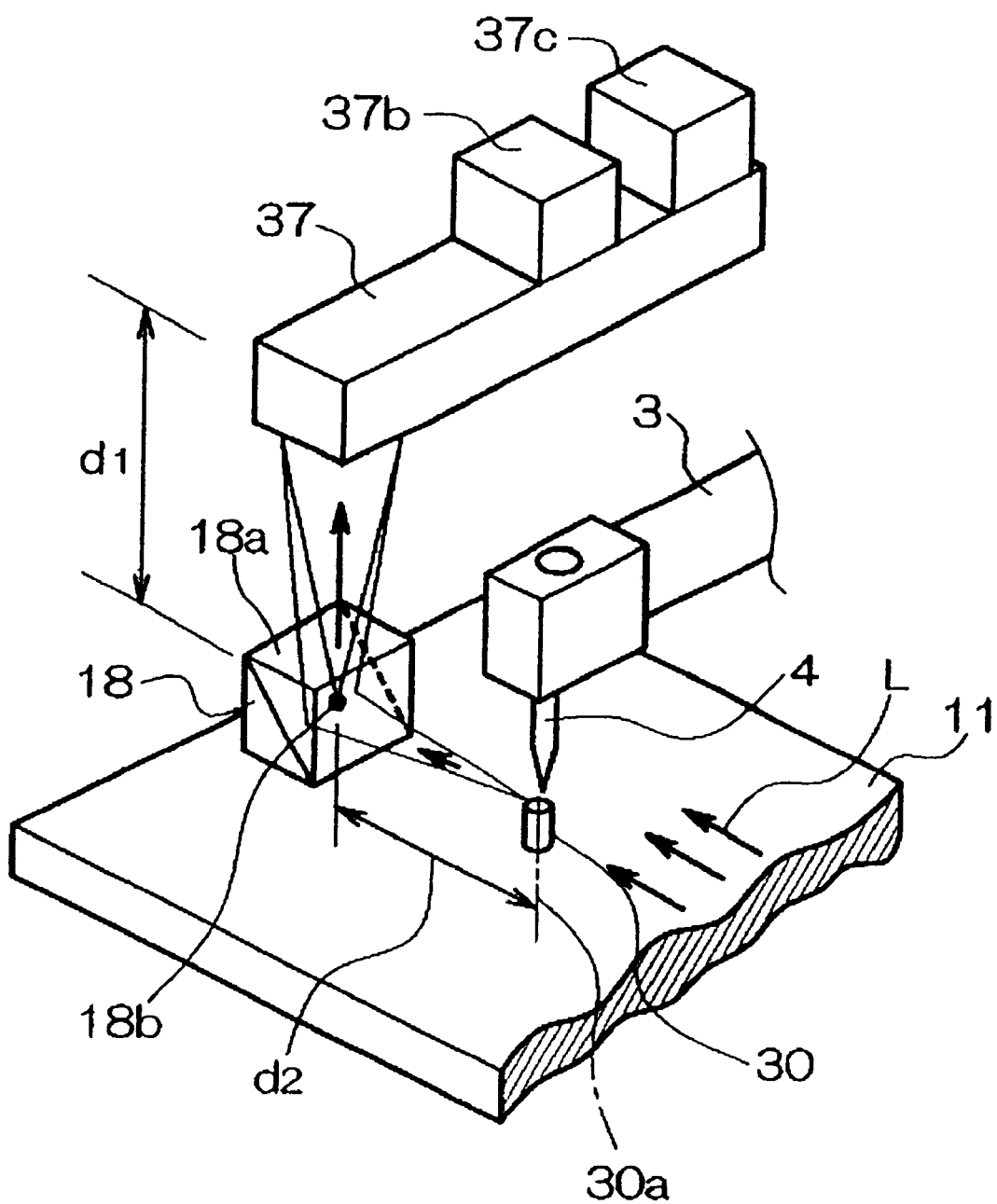
FIG. 9 is a perspective view of the essential portion of the bonding apparatus according to the third and fourth embodiments of the present invention.

This third embodiment, which is shown in FIG. 9, is equipped with a position detection camera 37 that has imaging elements 37b and 37c installed in different positions. The focal position of the imaging element 37b is located at the center 18b of the reflective surface 18a of the prism 18, which is away from the image-focusing plane of the imaging element 37b by a distance of $d_1$, while the focal position of the imaging element 37c is located at the axial center 30a of the reference member 30, which is away from the image-focusing plane of the imaging element 37c by a distance of $d_1+d_2$. The remaining structures are the same as in the above-described second embodiment.

In this third embodiment, both the tool (bonding tool) 4 and the reference member 30 are imaged by the imaging element 37c. Then, the position detection camera 37 is moved so that it is caused to approach the reference member 30, and the reference member 30 is directly imaged by the imaging element 37b. Thus, in this structure, respective appropriate focal positions are selected not only when both the tool 4 and reference member 30 are imaged by the imaging element 37c but also when the reference member 30 is directly imaged by the imaging element 37b. Accordingly, the third embodiment is advantageous in that the imaging can be performed under favorable focusing conditions in all cases. In addition, there is no need for a mechanical operation that alters the focal position between the two imaging operations.

Next, the fourth embodiment of the present invention will be described with reference to FIG. 9.

Generally, in lenses for which no achromatic correction is made, the focal position varies according to the wavelength of the light rays. The fourth embodiment utilizes this phenomenon. More specifically, in this fourth embodiment, a leans for which no achromatic correction is made is used instead of the lens 7c shown in FIG. 8. In the fourth embodiment, the focal position for blue light is located at the center 18b of the reflective surface 18a of the prism 18, which is away from the image-focusing plane of the position detection camera 7 by a distance of $d_1$ and the focal position for red light is located on the axial center 30a of the reference member 30, which is away from the image-focusing plane of the position detection camera 7 by a distance of $d_1+d_2$. Furthermore, a blue light source and: a red light source are installed in the optical system of the position detection camera 7, and the optical system is constructed so that light rays from this blue light source and red light source are emitted along the optical axis 7a of the position detection camera 7. The remaining structures are the same as in the third embodiment shown in FIG. 9.

In the fourth embodiment, both the tool 4 and the reference member 30 are first imaged by the position detection camera 7 while being illuminated by the driving of the red light source. Then, the position detection camera 7 is moved so that it is caused to approach the reference member 30, and the reference member 30 is directly imaged while being illuminated by the driving of the blue light source. Accordingly, in the structure of the fourth embodiment, respective appropriate focal positions are selected when both the tool 4 and the reference member 30 are imaged using red light and when the reference member 30 is directly imaged using blue light. Thus, like the third embodiment, the fourth embodiment is advantageous in that the imaging can be performed under favorable focusing conditions in all cases and in that there is no need for a mechanical operation that alters the focal position between the two imaging operations.

Next, the fifth embodiment of the present invention will be described.

Figure 10:
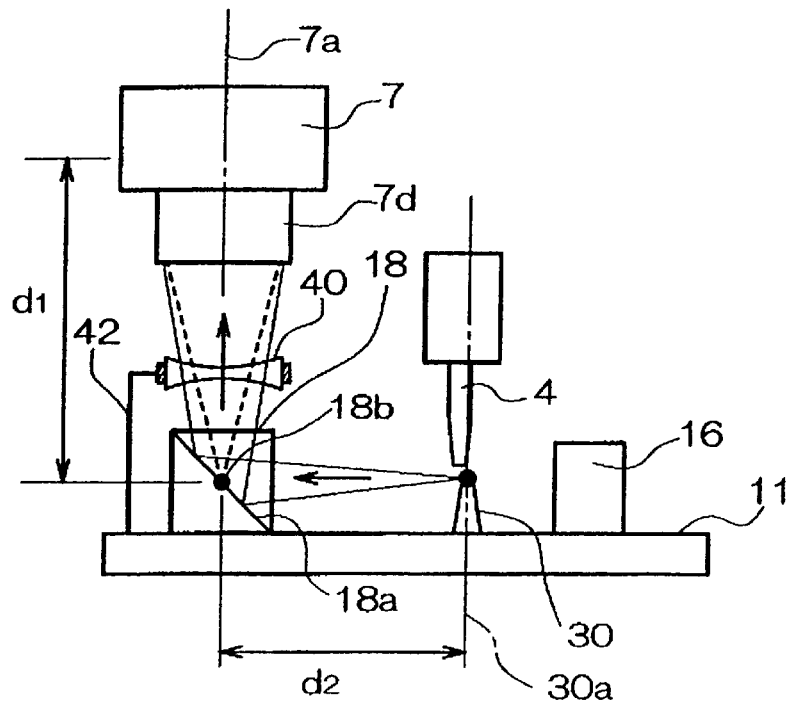
FIG. 10 is a front view of the essential portion of the fifth embodiment of the present invention.

As seen from FIG. 10, in this fifth embodiment, a corrective lens 40 is provided. It is not necessary that the lens 7d mounted in the position detection camera 7 be a telecentric lens. The focal position in a case where only the lens 7d is used is located at the center 18b of the reflective surface 18a of the prism 18, which is away from the image-focusing plane of the position detection camera 7 by a distance of $d_1$.

Furthermore, when both the lens 7d and the corrective lens 40 are used, the focal point is located at the axial center 30a of the reference member 30, which is away from the image-focusing plane of the position detection camera 7 by a distance of $d_1+d_2$. The corrective lens 40 is fastened to the reference member supporting stand 11 by a corrective lens supporting stand 42. In this fifth embodiment, prisms 93 and a half-mirror 95 which are disposed in the same manner as in FIG. 14A are used; however, these optical elements are omitted from FIG. 10.

Furthermore, in the fifth embodiment of FIG. 10, both the tool 4 and the reference member 30 are imaged by the position detection camera 7 via the corrective lens 40 and prism 18. The distance to the focal position in this case is $d_1+d_2$, since the corrective lens 40 is interposed. The position detection camera 7 is next moved so that it is caused to approach the reference member 30, and the reference member 30 is directly imaged by the position detection camera 7 in this state. The distance to the focal position in this case is $d_1$, since the corrective lens 40 is not interposed.

Thus, in the fifth embodiment, the distance to the focal position is changed by means of a corrective lens 40 which is held by the reference member supporting stand 11 and is thus held as an integral unit with the reference member 30. Accordingly, the corrective lens 40 is interposed in the light path when the tool 4 and reference member 30 are moved into the attitude in which the tool 4 and reference member 30 are imaged. Consequently, the fifth embodiment is advantageous in that there is no need for a focusing operation by mechanical or electrical means between the imaging operation in which both the tool 4 and the reference member 30 are imaged by the position detection camera 7, and the imaging operation in which the reference member 30 is directly imaged by the position detection camera 7.

Figure 11:
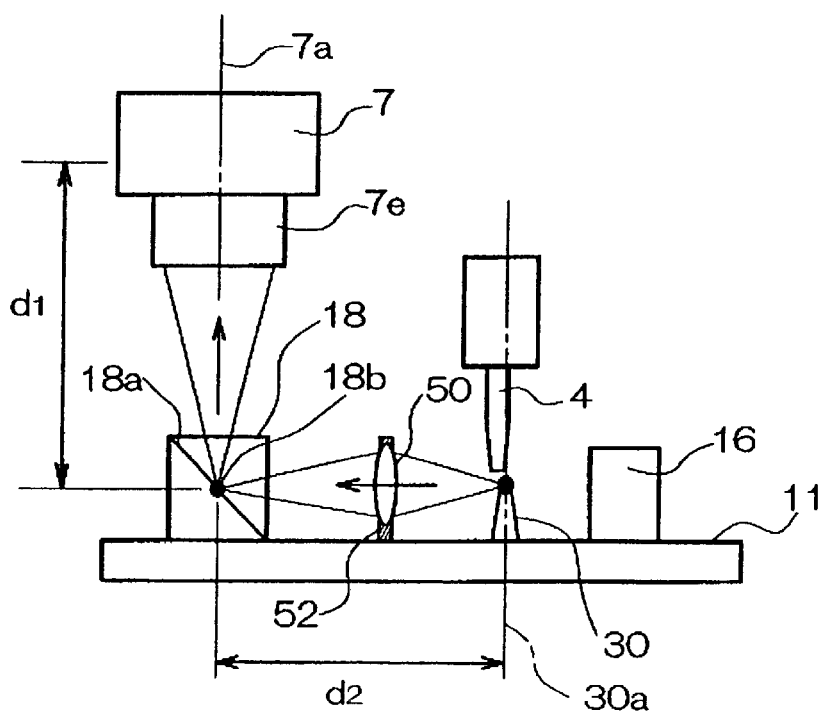
FIG. 11 is a front view of the essential portion of the sixth embodiment of the present invention of the fifth embodiment of the present invention.

Next, the sixth embodiment of the present invention will be described with reference to FIG. 11.

In the sixth embodiment, a corrective lens 50 is provided. The prisms 93 and a half-mirror 95 which are disposed in more or less the same manner as in FIG. 14A are used. However, in the sixth embodiment, the corrective lens 50 is interposed between the prisms 93 and the half-mirror 95. The corrective lens 50 is fastened to the reference member supporting stand 11 by a corrective lens supporting stand 52 and contacts the prisms 93 and half-mirror 95. In order to facilitate understanding, the prisms 93 and half-mirror 95 are omitted from FIG. 11, and only the corrective lens 50 is shown in model form.

The lens 7e provided on the position detection camera 7 need not be a telecentric lens. When only the lens 7e is used, the focal position is located at the center 18b of the reflective surface 18a of the prism 18. When both the lens 7e and the corrective lens 50 are used, the focal position is located at the axial center 30a of the reference member 30.

In the sixth embodiment, both the tool 4 and the reference member 30 are imaged by the position detection camera 7 via the corrective lens 50 and the prism 18. The distance to the focal position in this case is $d_1+d_2$, since the corrective lens 50 is interposed. Then, the position detection camera 7 is moved so that it is caused to approach the reference member 30, and the reference member 30 is directly imaged by the position detection camera 7 in this state. The distance to the focal position in this case is $d_1$, since the corrective lens 50 is not interposed.

Thus, in the sixth embodiment, the same advantages as those of the fifth embodiment are obtained. In addition, since the corrective lens 50 is installed at a relatively low height, the additional advantage of the possibility of designing a relatively compact apparatus is obtained. Furthermore, this sixth embodiment differs from the fifth embodiment in that images of the tool 4 and reference member 30 are focused at the center 18b of the reflective surface 18a of the prism 18, and these images are relayed. Accordingly, sharper images can be obtained.

Figure 12:
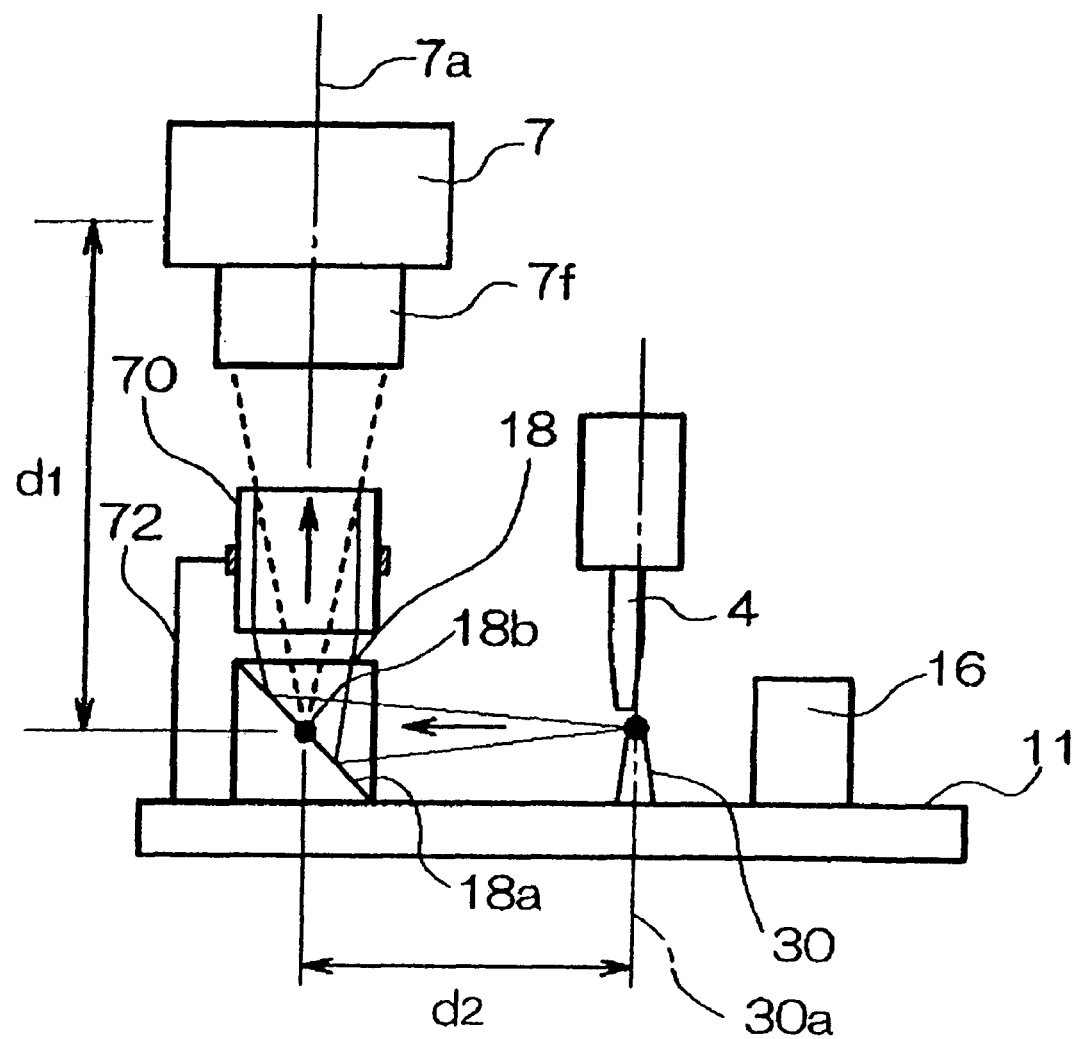
FIG. 12 is a front view of the essential portion of the seventh embodiment of the present invention.

Next, the seventh embodiment will be described. In this seventh embodiment, as seen from FIG. 12, a parallel flat plate 70 is provided; and prisms 93 and a half-mirror 95 disposed in the same manner as that shown in FIG. 14A are used. However, these optical elements are omitted from FIG. 12. The lens 7f mounted in the position detection camera 7 need not be a telecentric lens. When only the lens 7f is used, the focal position is located at the center 18b of the reflective surface 18a of the prism 18. Furthermore, when both the lens 7f and the parallel flat plate 70 are used, the focal position is located at the axial center 30a of the reference member 30. The parallel flat plate 70 is fastened to the reference member supporting stand 11 by a parallel flat plate supporting stand 72.

The material of the parallel flat plate 70 is glass. Since the refractive index of the parallel flat plate 70 differs from the refractive index of air, the distance to the focal position can be varied by interposing this parallel flat plate 70. Some other transparent material such as a plastic, etc. may be used for the parallel flat plate 70.

In the seventh embodiment, both the bonding tool 4 and the reference member 30 are imaged by the position detection camera 7 via the parallel flat plate 70 and prism 18. The distance to the focal position in this case is $d_1+d_2$, since the parallel flat plate 70 is interposed. Next, the position detection camera 7 is moved so that it is caused to approach the reference member 30, and the reference member 30 is directly imaged by the position detection camera 7 in this state. The distance to the focal position in this case is $d_1$, since the parallel flat plate 70 is not interposed. Accordingly, the seventh embodiment is as advantageous as in the fifth embodiment can be obtained.

Figure 13A:
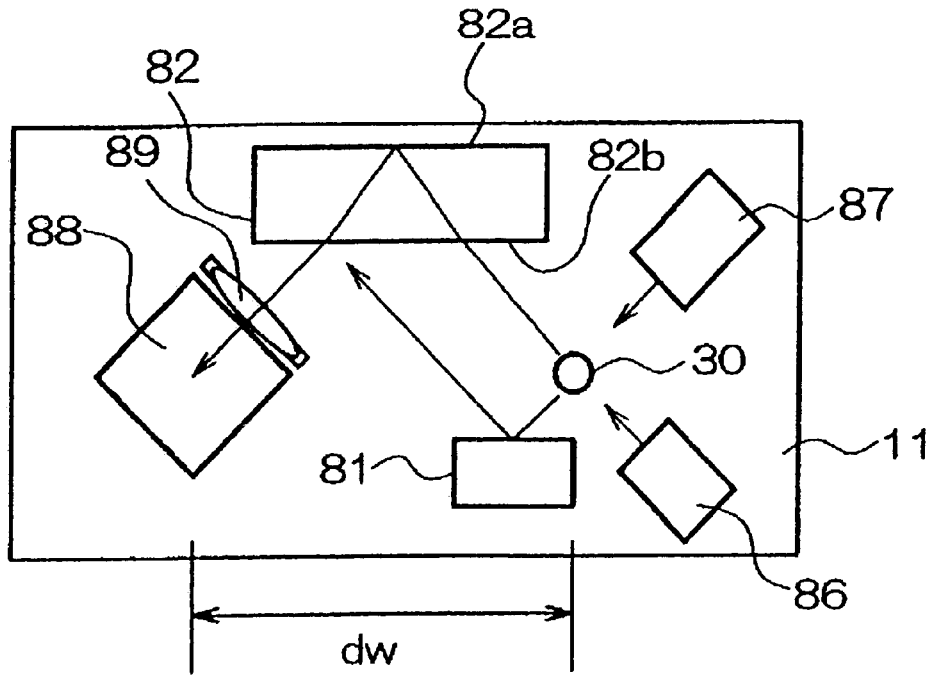
FIG. 13A is a plan view of the essential portion of the eighth embodiment of the present invention.
Figure 13B:
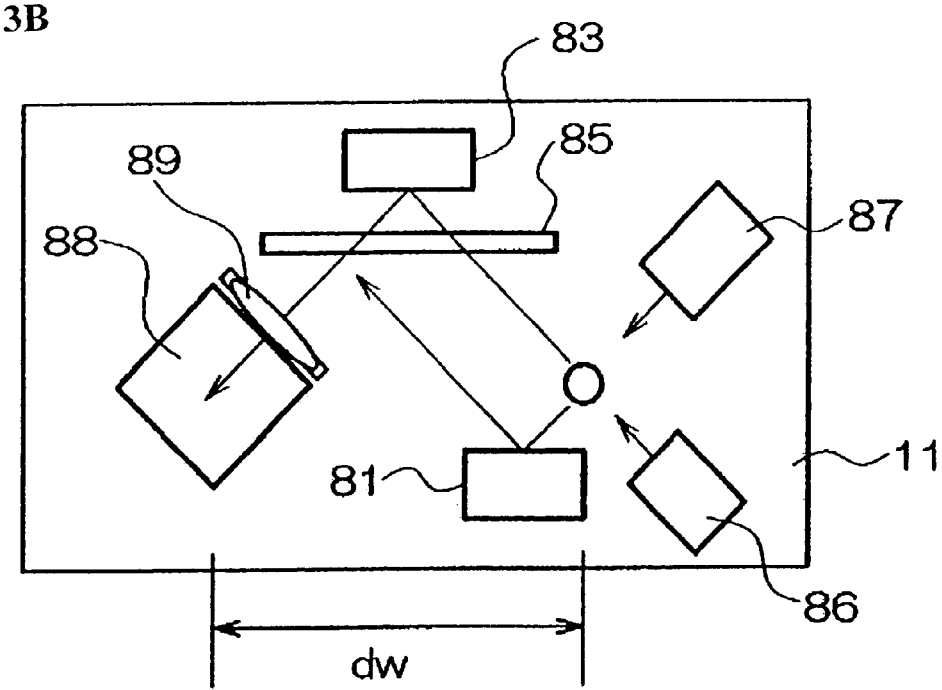
FIG. 13B is a plan view of the essential portion of a modification of the seventh embodiment.

Next, the eighth embodiment of the present invention will be described. This eighth embodiment shown in FIGS. 13A and 13B is a modification of the optical members shown in the sixth embodiment. In the eighth embodiment, as seen from FIG. 13A, a mirror 81 and a half-mirror 82, which has a mirror surface 82a and a half-mirror surface 82b, are installed parallel to each other in place of the prisms 93 and half-mirror 95 of the sixth embodiment. The reference member 30 is illuminated from two directions by laser diodes 86 and 87. A prism 88 and a corrective lens 89 are installed in the path of the reflected light. The prism 88 has a reflective surface that is inclined by an angle of 45° in order to reflect the reflected light upward and conduct this light to the position detection camera 7. The corrective lens 89 is fastened to the reference member supporting stand 11 and corrects the distance to the focal position in the same manner as in the sixth embodiment. The interval dw between the center of the reflective surface of the prism 88 and the reference member 30 is substantially equal to the offset amount Xt between the optical axis 7a of the position detection camera 7 and the axial center 4a of the tool 4 in the X direction. The remaining structures are the same as in the sixth embodiment shown in FIG. 11.

In this eighth embodiment, as in the sixth embodiment, both the tool 4 and the reference member 30 are imaged by the position detection camera 7 via the corrective lens 89 and half-mirror 82. Next, the position detection camera 7 is moved so that it is caused to approach the reference member 30, and the reference member 30 is directly imaged by the position detection camera 7 in this state.

In addition to the same advantages as in the sixth embodiment, this eighth embodiment offers an additional advantage in which a smaller number of optical members than in the first through sixth embodiments is required.

In the half-mirror 82 used in the eighth embodiment, the refractive index of the material of the half-mirror (e.g., glass) differs from the refractive index of air. Accordingly, the thickness of the glass must be adjusted so that the lengths of the light paths of the light from two directions are equal. For this purpose, it is also possible to use a structure in which a mirror 83 and a bericle beam splitter 85 are installed as shown in FIG. 13B instead of the half-mirror 82. In this case, the thickness of the bericle beam splitter 85 can be virtually ignored. Thus, it is advantageous in that the light path lengths of the light from two directions can easily be made equal.

Figure 15:
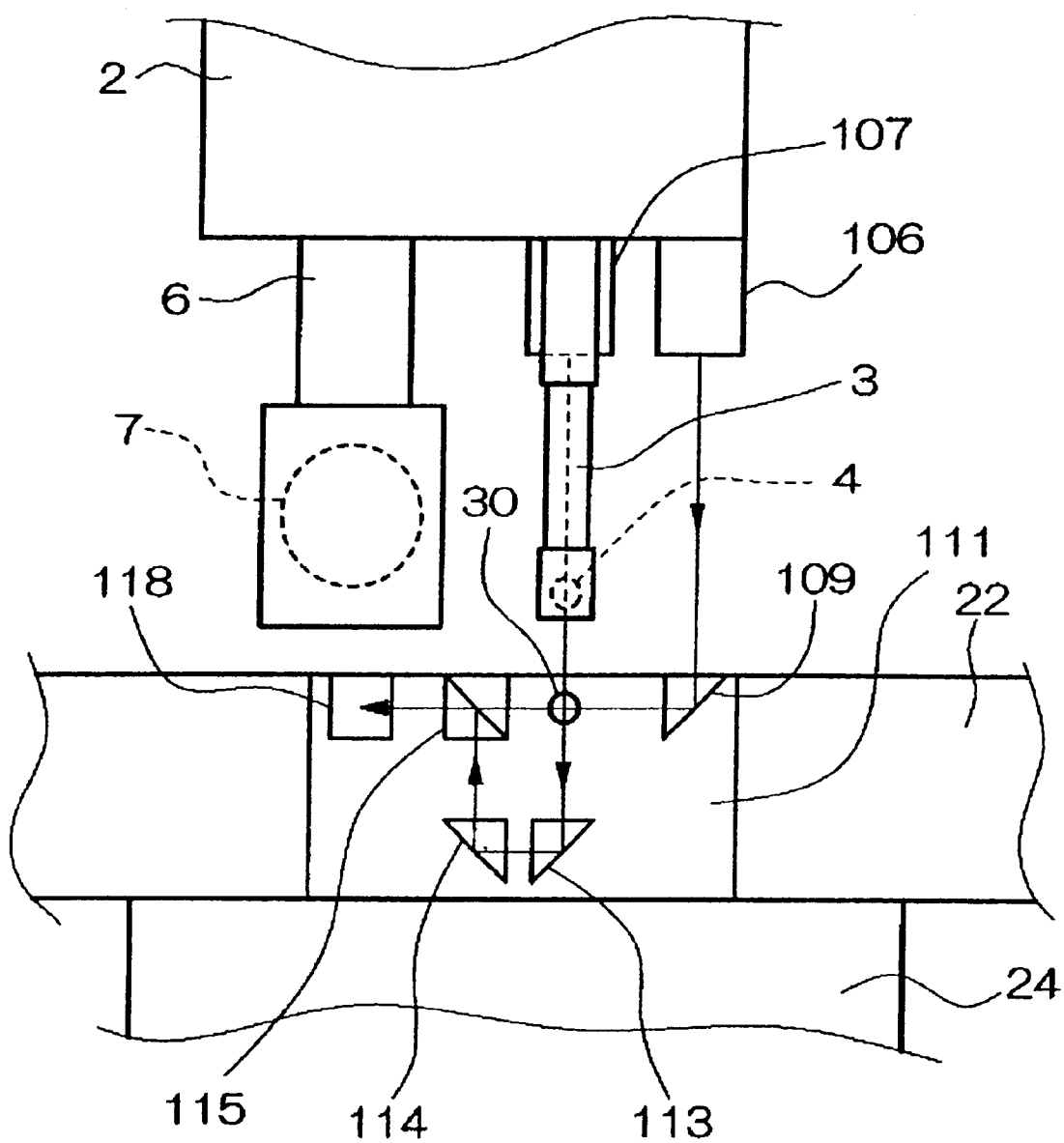
FIG. 15 is a plan view of the essential portion of the ninth embodiment of the present invention of the present invention.

Next, a ninth embodiment will be described. In this ninth embodiment, which is shown in FIG. 15, laser diodes 106 and 107 which make the light sources are installed on the bonding head 2 and not on the reference member supporting stand 111. In this ninth embodiment, the laser diodes 106 and 107 are fastened to the bonding head 2 so that the laser diode 107 faces a prism 113. In addition, the laser diode 106 faces a prism 109 that is installed on the reference member supporting stand 111, in an attitude in which the tool 4 is caused to approach the reference member 30. The reference numeral 22 is a lead frame conveying rail, and 24 is a bonding stage on which bonding objects (not shown) are held. In the ninth embodiment, the laser diodes 106 and 107 are installed on the bonding head 2. The advantages of this structure is that the reference member supporting stand 111 can be designed with a smaller size than is possible in a structure on which these laser diodes are installed on the reference member supporting stand 111, and the laser diodes 106 and 107, which are vulnerable to heat, can be protected from the high heat of the bonding stage 24. Furthermore, a substantially the same effect can also be obtained using prisms 103 and a half-mirror 105 as shown in FIG. 14B instead of the prisms 113 and 114 and half-mirror 115 used in this embodiment.

Figure 16:
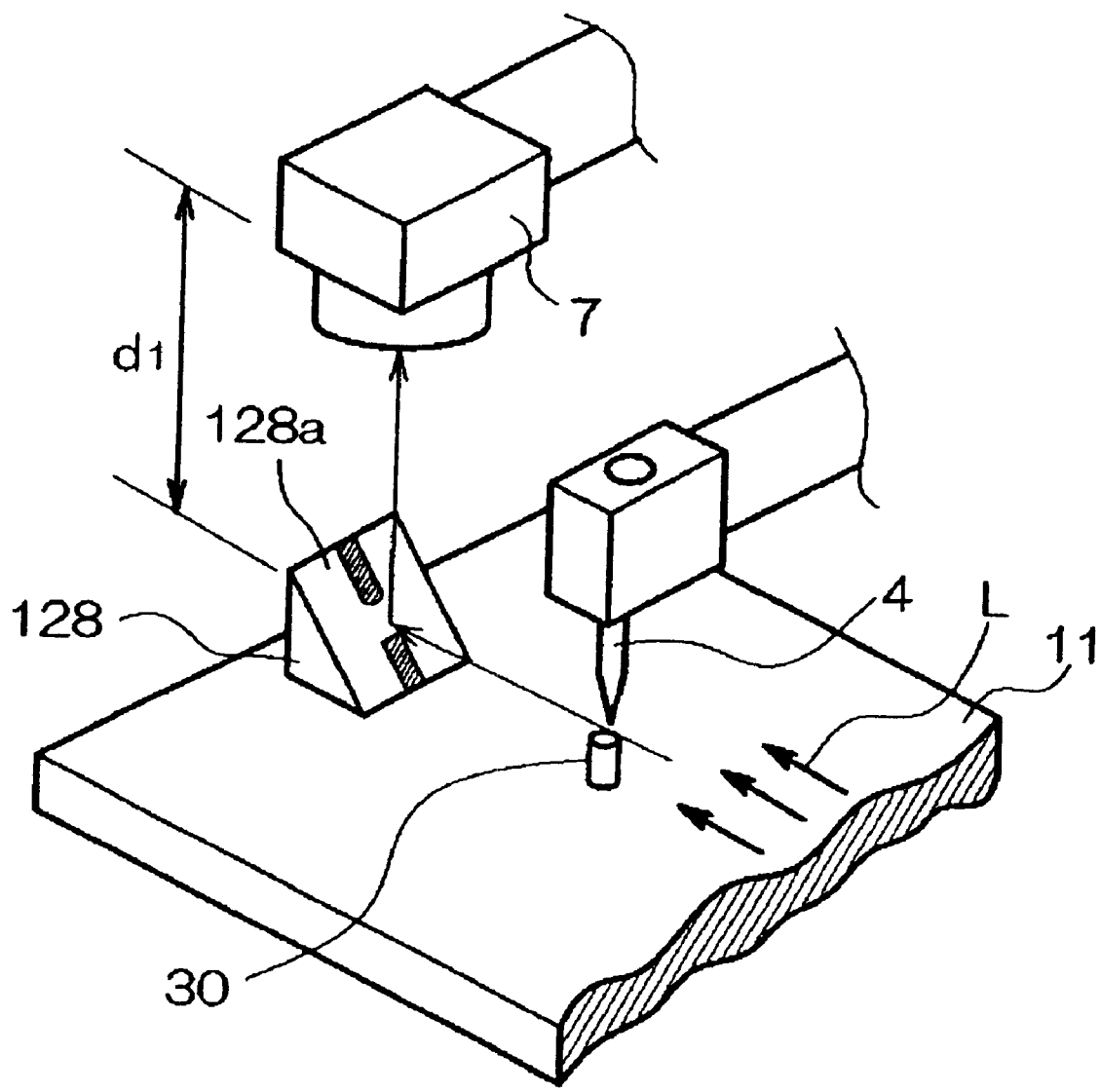
FIG. 16 is a perspective view of the essential portion of the tenth embodiment of the present invention.

Next, the tenth embodiment will be described with reference to FIG. 16. The embodiments described above are constructed so that images of the tool 4 and reference member 30 are conducted to the position detection camera 7 via the prisms 18, 88, 108 and 118. In this tenth embodiment, images of the tool 4 and reference member 30 are projected onto a screen member 128.

The screen member 128 includes a projection surface 128a which is inclined at an angle of 45° with respect to the direction of incidence of the light rays L. This projection surface 128a is formed by coating the surface of a mirror with a light-diffusing substance. In regard to the material of the projection surface 128a or screen member 128, substances which have light-diffusing properties such as ground glass, platings, ceramics, resins, etc. are also suitable. Furthermore, fluorescent materials and phosphorescent materials may be used; and in cases where infrared light is used as the light source, an infrared-sensitive sheet (e.g., IR Detection Card (trademark) marketed by Kodak Co.) may be appropriate. Furthermore, a temperature-sensitive sheet, which uses a liquid crystal, etc. and changes color according to the temperature, may also be used.

The distance $d_1$ from the position detection camera 7 (in an attitude in which the tool 4 is caused to approach the reference member 30) to the projection surface 128a of the screen member 128 is substantially equal to the distance from the position detection camera 7 (in an attitude in which the positions of bonding objects are detected by the position detection camera 7) to the bonding objects and is also equal to the distance from the position detection camera 7 (in an attitude in which the reference member 30 is directly imaged by the position detection camera 7) to the reference member 30. Accordingly, when this position detection camera 7 is used, the projection surface 128a and the reference member 30 can be imaged without changing the focus that is used when the positions of bonding objects are detected. The prisms 13 and 14, half-mirror 15 and laser diodes 16 and 17 which are as those used in the first embodiment are also installed in this embodiment. However, these elements are omitted from FIG. 16.

In the tenth embodiment, shadows of the tool 4 and reference member 30 illuminated by the laser diodes 16 and 17 are projected onto the projection surface 128a of the screen member 128. If the shadows of the tool 4 and reference member 30 projected onto the projection surface 128a are imaged, the clear images of the tool 4 and reference member 30 can be obtained regardless of the distance from the projection surface 128a to the reference member 30. Accordingly, the optical members can be freely designed, and a means that corrects the focal position such as the corrective lens 40 used in the fifth embodiment is not needed.

Next, the eleventh embodiment of the present invention will be described.

Figure 17:
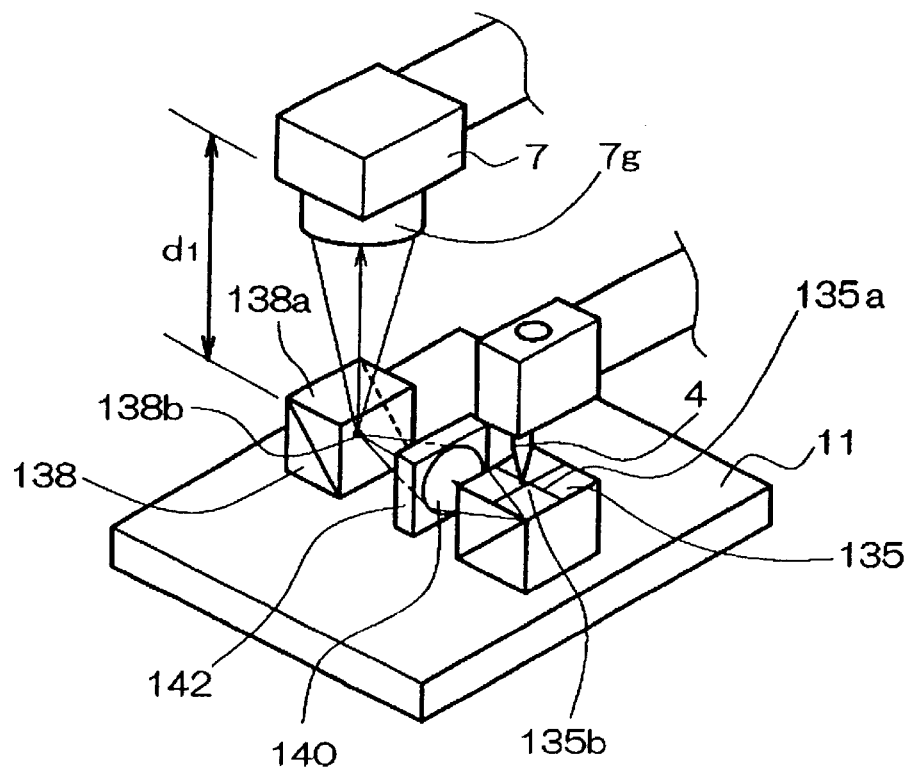
FIG. 17 is a perspective view of the essential portion of the eleventh embodiment of the present invention.
Figure 18:
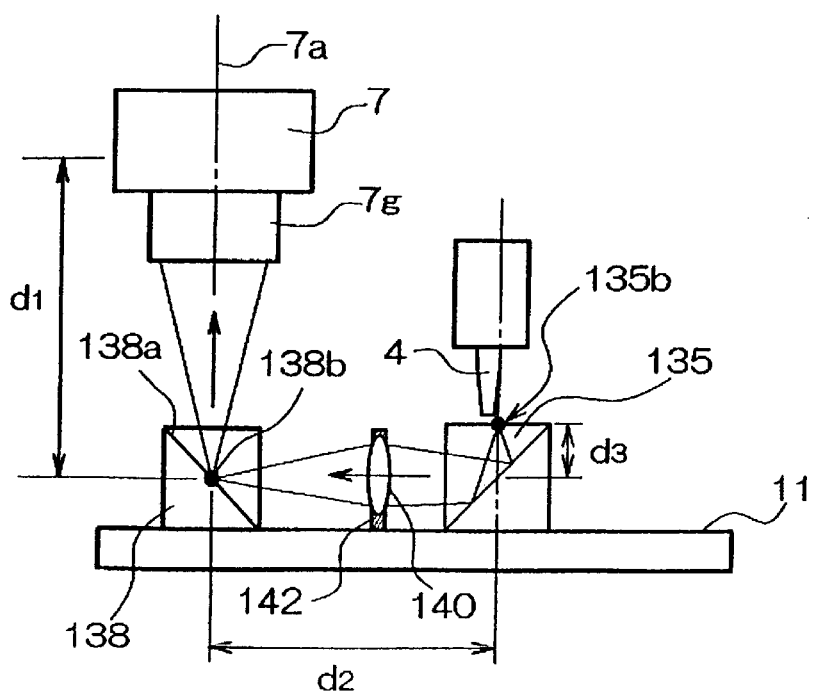
FIG. 18 is a front view thereof.

This eleventh embodiment shown in FIGS. 17 and 18 is characterized in that a prism 135 that has reference marks 135a on its upper surface is employed. The lens 7g that is mounted in the position detection camera 7 need not: be a telecentric lens. When only the lens 7g is used, the focal position is located at the center 138b of the reflective surface 138a of the prism 138, which is away from the image-focusing plane of the position detection camera 7 by a distance of d1. When both the lens 7g and the corrective lens 140 are used, the focal position is located at the center 135b of the reference marks 135a. The corrective lens 140 is fastened to the reference member supporting stand 11 by a corrective lens supporting stand 142.

In the eleventh embodiment, both the tool 4 and the reference marks 135a are imaged by the position detection camera 7 via the corrective lens 140 and prisms 135 and 138. Also, the amounts of deviation $\Delta X1$ and $\Delta Y1$ are determined by converting these images into electrical signals and performing image processing. Next, the position detection camera 7 is moved as to be caused to approach the reference marks 135a, and the reference marks 135a are directly imaged by the position detection camera 7 in this state. The amounts of deviation $\Delta X2$ and $\Delta Y2$ are then determined by converting this image into an electrical signal and performing image processing. Then, the accurate offset amounts are calculated from the abovementioned amounts of deviation using the above-described Numerical Expression 2.

Accordingly, in this eleventh embodiment, the distance to the focal position is varied by a corrective lens 140 which is held as an integral unit with the reference member supporting stand 11 and thus with the reference marks 135a. Accordingly, the corrective lens 140 is interposed in the light path when the tool 4 and reference marks 135a are moved into the attitude in which the tool 4 and reference marks 135a are imaged. There is, thus, no need for a focusing operation by mechanical or electrical means between the imaging operation in which both the tool 4 and the reference marks 135a are imaged by the position detection camera 7 and the imaging operation in which the reference marks 135a are directly imaged by the position detection camera 7.

Furthermore, switching of light sources, etc. between the acquisition of images in the X direction and the acquisition of images in the Y direction when the tool 4 and reference marks 135*a* are imaged can also be eliminated. In addition, in a case where a telecentric lens is used as the lens 7*g*, in a case where an operation that alters the focal position is performed between the two imaging operations, and in a case where a plurality of imaging elements with different focal positions are used, the detection of positional relationships based on both imaging operations can be accurately accomplished; and this is done even if no corrective lens 140 is provided. Furthermore, the dimensions of the prisms 135 and 138 and the corrective lens 140 can be selected appropriately, so that these elements are installed in contact with each other.

In the first through eleventh embodiments described above, light sources oriented in two mutually different directions are selectively lit, i.e., in which one light source is extinguished while the other light source is lit. Instead of such a structure, it is also possible to use a structure in which the brightness ratio of the two light sources is varied by, for instance, raising the brightness of one of the two light sources and lowering the brightness of the other light source. Moreover, it is also possible to design so that the wavelengths of the two light sources are set at different wavelengths, the images acquired by the position detection camera 7 are separated according to wavelength, and image processing is performed on the separated images of respective wavelengths. In this structure, furthermore, the two light sources can be simultaneously lit.

Furthermore, in the above-described first through tenth embodiments, the amounts of deviation between the tool 4 and reference member 30 are measured using images of these two elements that are captured at angles differing by 90°. However, the relative angle between these elements needs not be 90°. Also, the position in which the reference member is installed is not limited to the position shown in the respective embodiments. The reference member can be installed in a position that is closer to the bonding object. Furthermore, some type of projection or a through-hole with a shape suitable for detection that is formed on or in the bonding object itself (e.g., lead frame) can be used as a reference member.

Furthermore, in the respective embodiments described above, the positional relationship between the position detection camera 7 and the reference member 30 (or reference marks 135*a*) is measured, the bonding tool is moved, and then the positional relationship between the tool 4 and the reference member 30 (or reference marks 135*a*) is measured. However, the order of the two measurement operations may be reversed. Furthermore, in the described embodiments, the processing member is single tool 4. However, the present invention can be applied to the measurement of offset amounts between a plurality of working head (that perform physical work on semiconductor devices) and a position detection imaging device and to the measurement of offset amounts among such a plurality of working heads.

In addition, in the above-described embodiments, prisms, half-mirror and mirrors are used as optical members. However, in the present invention, any optical member that can conduct image light of the processing member(s) and reference member 30 (or reference marks 135*a*) to the position detection imaging device can be used. For example, optical fibers can be used so that they are oriented at different angles with respect to the reference member 30. Moreover, in the above embodiments, a camera is used as an imaging device. However, any imaging device can be used in the present invention as far as it has a structure that can detect light. For example, a line sensor may be used. Furthermore, the above embodiments is described with reference to a wire bonding apparatus. However, it goes without saying that the present invention can be applied to various other types of bonding apparatuses, including die bonding apparatuses, tape bonding apparatuses, flip-chip bonding apparatuses, etc.

What is claimed is:

1. A bonding apparatus comprising:
    a single position detection imaging device that images bonding objects,
    a reference member that is disposed in a specified position where said reference member is imaged by said single position detection imaging device,
    a processing member that processes said bonding objects, said process member being relatively movable to a position adjacent said reference member where said processing member is imaged by said single position detection imaging device, and
    optical members that conduct image light of said reference member and of said processing member to said position detection imaging device.

2. A bonding apparatus according to claim 1, wherein said optical members conduct image light of said processing member and said reference member captured from a plurality of different directions to said position detection imaging device.

3. A bonding apparatus according to claim 1 or 2, wherein said position detection imaging device is provided with a telecentric lens.

4. A bonding apparatus according to claims 1 or 2, wherein
    a corrective lens is further disposed in a light path that leads to said position detection imaging device, and
    images of said reference member and processing member are focused on an image-focusing plane of said position detection imaging device via said corrective lens.

5. A bonding apparatus according to claim 3, wherein
    a corrective lens is further disposed in a light path that leads to said position detection imaging device, and
    images of said reference member and processing member are focused on an image-focusing plane of said position detection imaging device via said corrective lens.

6. A bonding apparatus according to claim 4, wherein said corrective lens is held as an integral unit with said reference member.

7. A bonding apparatus according to claim 5, wherein said corrective lens is held as an integral unit with said reference member.

8. A bonding apparatus comprising:
    single position detection imaging device that images bonding objects,
    a reference member that is disposed in a specified position where said reference member is imaged by said single position detection imaging device,
    a processing member that processes said bonding objects, said process member being relatively movable to a position adjacent said reference member where said processing member is imaged by said single position detection imaging device,
    a light source that is used to illuminate said reference member and said processing member, and
    a screen member onto which images of said processing member and said reference member are projected by illumination from said light source, wherein a distance from said position detection imaging device to said bonding objects when said position detection imaging device is in an attitude in which said bonding objects are imaged by said position detection image device is substantially equal to a distance from said position detection imaging device to said screen member when said position detection imaging device is in an attitude in which said processing member is caused to approach said reference member.

9. A bonding method used in a bonding apparatus that comprises: a single position detection imaging device that images bonding objects, a reference member that is disposed in a specified position where said reference member is imaged by said single position detection imaging device and a processing member which is installed so as to be offset with respect to said position detection imaging device to process said bonding objects but relatively movable to a position adjacent said reference member where said processing member is imaged by said single position detection imaging device, said bonding method comprising the steps of:

measuring, by said single position detection imaging device, a positional relationship between said reference member and said single position detection imaging device in a first attitude in which said single position detection imaging device is caused to approach said reference member, conducting an image light of said reference member and said processing member in a second attitude in which said processing member is caused to approach said reference member to said single position detection imaging device and then measuring, by said single position detection imaging device, a positional relationship between said processing member and said reference member, and determining an accurate offset amount based upon results of said measuring and upon amounts of movement of said single position detection imaging device and said processing member between said first attitude and second attitude.

10. A bonding apparatus comprising a single position detection imaging device that images bonding objects;

a reference member that is disposed in a specified position where said reference member is imaged by said single position detection imaging device, a processing member which is installed so as to be offset with respect to said single position detection imaging device to process said bonding objects, said processing member further being relatively movable to a position adjacent said reference member where said processing member is imaged by said singe position detection imaging device; and an operation control device that determines an amount of offset based upon:
  (i) a measured value obtained, by said position detection imaging device, when a positional relationship between said reference member and said position detection imaging device in a first attitude in which said position detection imaging device is caused to approach said reference member,
  (ii) a measured value obtained by conducting an image light of said reference member and said processing member in a second attitude in which said processing member is caused to approach said reference member to said position detection imaging device, and then by measuring a positional relationship between said processing member and said reference member by said position detection imaging device, and
  (iii) results of said measuring and amounts of movement of said position detection imaging device and said processing member between said first attitude and second attitude.

* * * * *